(12) United States Patent
Yang

(10) Patent No.: US 9,535,107 B2
(45) Date of Patent: Jan. 3, 2017

(54) APPARATUS FOR DIAGNOSING DC LINK CAPACITOR OF INVERTER

(71) Applicant: LSIS CO., LTD., Anyang-si, Gyeonggi-do (KR)

(72) Inventor: Jin Kyu Yang, Gunpo-si (KR)

(73) Assignee: LSIS CO., LTD., Anyang-si (KR)

( * ) Notice: Subject to any disclaimer, the term of this patent is extended or adjusted under 35 U.S.C. 154(b) by 2 days.

(21) Appl. No.: 13/903,880

(22) Filed: May 28, 2013

(65) Prior Publication Data
US 2014/0002104 A1    Jan. 2, 2014

(30) Foreign Application Priority Data

Jul. 2, 2012   (KR) .......................... 10-2012-0071773

(51) Int. Cl.
*G01R 31/42* (2006.01)
*G01R 31/02* (2006.01)

(52) U.S. Cl.
CPC ............. *G01R 31/028* (2013.01); *G01R 31/42* (2013.01)

(58) Field of Classification Search
CPC .............................. G01R 31/42; G01R 31/028
USPC .... 324/548, 537, 658, 101–179; 702/58, 63, 702/65
See application file for complete search history.

(56) References Cited

U.S. PATENT DOCUMENTS

| | | | |
|---|---|---|---|
| 5,798,648 A | 8/1998 | Ueyama et al. | |
| 7,432,616 B2 * | 10/2008 | Hatai | H02M 7/53871 307/66 |
| 2002/0085397 A1 | 7/2002 | Suzui et al. | |
| 2003/0195719 A1 * | 10/2003 | Emori | B60W 10/26 702/183 |
| 2009/0072839 A1 | 3/2009 | Kim et al. | |
| 2010/0070212 A1 | 3/2010 | Williams | |
| 2010/0295554 A1 | 11/2010 | Alho | |
| 2011/0031922 A1 * | 2/2011 | Sakai | H02P 27/08 318/519 |
| 2011/0199030 A1 | 8/2011 | Suzuki | |

(Continued)

FOREIGN PATENT DOCUMENTS

| | | |
|---|---|---|
| CN | 101997424 | 3/2011 |
| CN | 102057282 | 5/2011 |

(Continued)

OTHER PUBLICATIONS

Japan Patent Office Application Serial No. 2013-117679, Office Action dated Jun. 3, 2014, 3 pages.

(Continued)

*Primary Examiner* — Son Le
*Assistant Examiner* — Akm Zakaria
(74) *Attorney, Agent, or Firm* — Lee Hong Degerman Kang & Waimey

(57) ABSTRACT

The present disclosure relates to an apparatus for diagnosing a DC link capacitor. A DC voltage provided from a power supplier to a motor is controlled to have a predetermined level (or magnitude). When a voltage of the DC link reaches a predetermined voltage, the ratio of change of capacitance values of the DC link capacitor is estimated, by considering power consumption of a resistor of the motor (i.e., power consumption of a load), power consumption of the power supplier and a switching loss of an inverter part, and a deteriorated level of the DC link capacitor is diagnosed using the estimated ratio.

12 Claims, 6 Drawing Sheets

(56) References Cited

U.S. PATENT DOCUMENTS

| | | | | |
|---|---|---|---|---|
| 2013/0027047 A1* | 1/2013 | Yoshioka | ........... | G01R 31/3651 |
| | | | | 324/426 |
| 2014/0029308 A1* | 1/2014 | Cojocaru | ................ | H01G 4/38 |
| | | | | 363/13 |

FOREIGN PATENT DOCUMENTS

| | | | | |
|---|---|---|---|---|
| JP | 63-048162 | | | 2/1988 |
| JP | 5-215800 | | | 8/1993 |
| JP | 11098854 | A | * | 4/1999 |
| JP | 11231008 | | * | 4/1999 |
| JP | 2007-295655 | | | 11/2007 |
| JP | 2008-011670 | | | 1/2008 |
| JP | 2008-094342 | | | 4/2008 |
| JP | 2009-168587 | | | 7/2009 |
| KR | 10-2004-0111632 | | | 12/2004 |
| KR | 10-2012-0027367 | | | 3/2012 |
| WO | 2004/084395 | | | 9/2004 |

OTHER PUBLICATIONS

Aeloiza, et al., "A Real Time Method to Estimate Electrolytic Capacitor Condition in PWM Adjustable Speed Drives and Uninterruptible Power Supplies," Power Electronics Specialists Conference, IEEE 36th, XP-31000530, Jan. 2005, pp. 2867-2872.

Vogelsberger, et al., "Life-Cycle Monitoring and Voltage-Managing Unit for DC-Link Electrolytic Capacitors in PWM Converters," IEEE Transactions on Power Electronics, vol. 26, No. 2, Feb. 2011, pp. 493-503.

European Patent Office Application Serial No. 13169542.1, Search Report dated Oct. 2, 2013, 7 pages.

\* cited by examiner

APPARATUS FOR DIAGNOSING DC LINK CAPACITOR OF INVERTER

CROSS-REFERENCE TO RELATED APPLICATION

Pursuant to 35 U.S.C. §119(a), this application claims the benefit of earlier filing date and right of priority to Korean Application No. 10-2012-0071773, filed on Jul. 2, 2012, the contents of which is incorporated by reference herein in its entirety.

BACKGROUND OF THE INVENTION

1. Field of the Invention

This specification relates to a technology of diagnosing an electrolytic capacitor, and particularly, to an apparatus and method for diagnosing a DC link capacitor of an inverter.

2. Background of the Invention

In general, an inverter is connected to a three-phase AC commercial power supply to smooth an AC input signal to generate a DC signal. The inverter varies a frequency and a magnitude of a voltage of the DC signal to generate a desired output voltage, thereby supplying the generated output to a motor. The inverter is widely being used in the industrial world in the aspects of energy efficiency and simplicity of output control.

An electrolytic capacitor for smoothing DC power (hereinafter, referred to as 'DC link capacitor') may be installed in the inverter to smooth the DC power into a predetermined level and accumulate or discharge electrical energy. Deterioration of such DC link capacitor is the most frequent cause of a breakdown of the DC link capacitor. Therefore, it is very important to diagnose a breakdown of the DC link capacitor by determining deterioration of the DC link capacitor.

FIG. 1 is a configuration view of an apparatus for diagnosing a DC link capacitor according to the related art.

An apparatus for diagnosing a DC link capacitor 112 of an inverter 110 according to the related art may be configured such that a resister 113 and a DC link capacitor 112 are connected in parallel to each other. Also, a contactor 114 may be connected in series to the resister 113. The contactor 114 may be normally open.

A voltage detector 116 may be connected in parallel to the DC link capacitor 112. A discharge time measuring circuit 117, a deterioration determining circuit 118 and an interface 119 may be connected to the voltage detector 116.

During a general operation of the inverter 110, an AC voltage (or AC power source) may be input using a breaker 100 connected to a rectifier 111 and a DC voltage (or DC power source) whose frequency is controlled by an inverter module 115 may be output to a motor 120.

Under this state, when power is cut off as the breaker 100 is open, the operation of the inverter module 115 may be stopped. Accordingly, the DC link capacitor 112 is in a charge-stored state. Here, when the contactor 114 is closed, the stored charge is discharged through the resistor 113.

If it is assumed that a capacitance of the capacitor 112 is C and a resistance of the resister 113 is R, a voltage between both poles may reduced due to the discharging according to an RC time constant. The change in the voltage may be detected by the voltage detector 116, and transferred to the discharge time measuring circuit 117. The discharge time measuring circuit 117 may measure a discharge time from the voltage change and transfer the measured discharge time to the deterioration determining circuit 118.

The deterioration determining circuit 118 may compare the discharge time with a preset reference time. When the discharge time is less than the reference time, the deterioration determining circuit 118 may output a deterioration determination signal to the outside using the interface 119.

As such, the related art diagnosing apparatus measures the change in capacitance by measuring the discharge time using a DC link voltage, and diagnoses deterioration of the capacitor accordingly.

However, the related art requires components only for diagnosis of capacitor deterioration, such as the resistance 113 and the contactor 114, which are not needed at the general operation. This may cause additional costs.

SUMMARY OF THE INVENTION

Therefore, an aspect of the detailed description is to provide an apparatus for diagnosing a DC link capacitor of an inverter, capable of diagnosing deterioration of the DC link capacitor of the inverter using a mounted motor, without requirements of additional circuits.

To achieve these and other advantages and in accordance with the purpose of this specification, as embodied and broadly described herein, there is provided an apparatus for diagnosing deterioration of a DC link capacitor of an inverter having the DC link capacitor and an inverter part, the apparatus including a current detector configured to detect a current supplied to a motor in the inverter part, a power supplier configured to supply a DC voltage, and a controller configured to control the DC voltage supplied from the power supplier to the motor to have a predetermined level, wherein the controller estimates the ratio of change of capacitances of the DC link capacitor, by considering power consumption of a resistor of the motor (power consumption of a load), power consumption of the power supplier and a switching loss of the inverter part, so as to diagnose a deteriorated level of the DC link capacitor using the estimated ratio of change, when a voltage of the DC link capacitor reaches a predetermined voltage.

In accordance with one exemplary embodiment, the inverter part may be configured by connecting a plurality of switching devices and a plurality of diodes, which are connected in parallel, respectively, in a form of a three-phase full bridge, and the controller may control the DC voltage supplied from the power supplier to have the predetermined level by controlling an ON or OFF state of the plurality of switching devices.

In accordance with one exemplary embodiment, the inverter part may be configured by connecting the plurality of switching devices and the plurality of diodes, which are connected in parallel, respectively, in the form of the three-phase full bridge. Here, first to third switching devices may form paths of first to third-phase currents supplied to the motor. The first switching device may form an upper leg and the second and third switching devices may form a lower leg.

In accordance with one exemplary embodiment, the controller may control the first to third switching devices to be switched on when a current supplied to the motor is lowered less than a reference current by a predetermined level in case where the current supplied into the motor flows in a free-wheeling mode.

In accordance with one exemplary embodiment, the controller may control the first switching device to be switched on and the second and third switching devices to be switched off when the current supplied to the motor increases more than a reference current by a predetermined level in case where the current supplied to the motor increases due to acquiring energy from the DC link capacitor.

In accordance with one exemplary embodiment, the controller may control the first switching device to be switched off and the second and third switching devices to be switched on when the current supplied to the motor increases more than a reference current by a predetermined level in case where the current supplied to the motor increases due to acquiring energy from the DC link capacitor.

In accordance with one exemplary embodiment, the controller may control the fourth to sixth switching devices to be switched off.

In accordance with one exemplary embodiment, the capacitance of the DC link capacitor may be estimated by the following equation.

$$C = 2 \cdot k \cdot P_R \cdot (t_2 - t_1) \cdot \frac{1}{(V_1^2 - V_2^2)}$$

where $P_R \cdot (t_2 - t_1)$ denotes energy consumed by a load, and k denotes a constant indicating a ratio of power consumption of the power supplier and the switching loss to the power consumption of the load.

In accordance with one exemplary embodiment, the change in the capacitance of the DC link capacitor may be estimated by the change of a ratio of a deteriorated capacitance to an initial capacitance of the DC link capacitor.

In accordance with one exemplary embodiment, the DC link capacitor may be diagnosed as being broken down when the change of the ratio is lowered less than a predetermined ratio.

In accordance with one exemplary embodiment, the controller may increase a voltage supplied by the power supplier by the maximum permissible limit so as to reduce the ratio of the power consumption of the power supplier and the switching loss to the power consumption of the load.

As described above, with use of a motor for discharging a DC link voltage, any additional circuit such as a discharge circuit may not be required and the ratio of change of capacitance values may be measured using a DC link voltage and a load current which are currently measured in an inverter.

The change in capacitance values may be estimated even if a measurement state is somewhat changed while the initial measurement state changes to a deteriorated state. This may allow the level of breakdown of the capacitance to be determined so as not to be sensitive to affection by an environment, as compared with the related art.

The diagnosis apparatus according to the present disclosure may be applied directly to commercial inverters which are on sale now. Also, without hardware change required, the diagnosis apparatus according to the present disclosure may be applied even to already sold inverters in an upgraded form of software.

Also, the diagnosis apparatus according to the preset disclosure may measure the change in capacitance more frequently than the related art diagnosis apparatus. This may result in improving reliability and efficiency of the inverter and preventing in advance accidents such as damages on components, occurrence of fire and the like, due to the breakdown.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
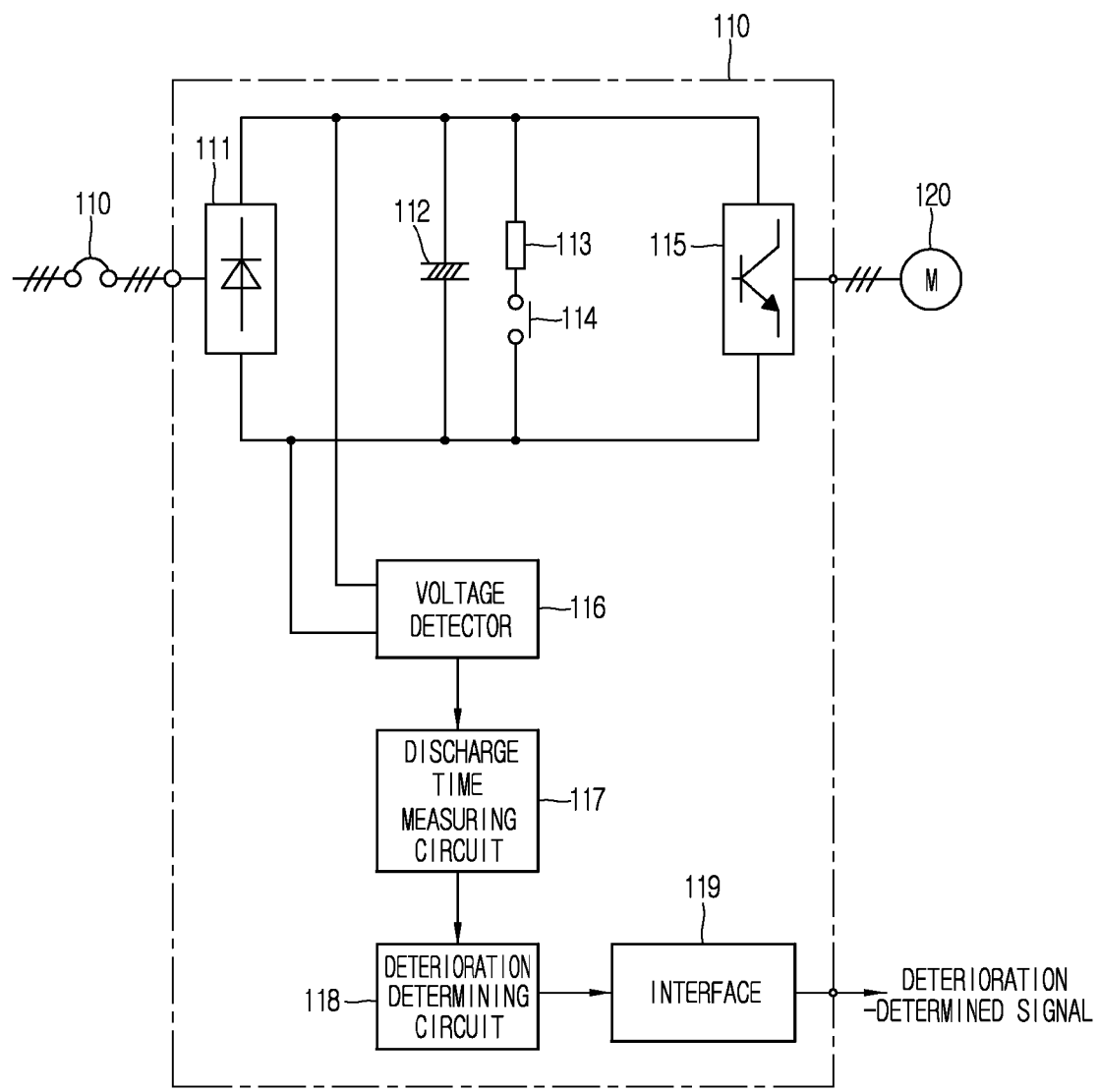
FIG. 1 is a configuration view of an apparatus for diagnosing a DC link capacitor according to the related art.

The present disclosure may have various variations and different embodiments, and thus specific embodiments will be illustrative in the drawings and detailed description thereof will be given in detail. However, it may not be intended to limit the present disclosure to the specific embodiments but should be understood to include all of the variations, modifications, equivalents and the like within the scope of the present disclosure and the claims.

The terms including an ordinal number such as first, second, etc. can be used to describe various elements, but the elements should not be limited by those terms. The terms are used merely for the purpose to distinguish an element from the other element.

It will be understood that when an element is referred to as being "connected with" another element, the element can be directly connected with the other element or intervening elements may also be present. In contrast, when an element is referred to as being "directly connected with" another element, there are no intervening elements present.

It should be noted that technological terms used herein are merely used to describe a specific embodiment, but not to limit the present invention. Incidentally, unless clearly used otherwise, expressions in the singular number include a plural meaning. In this application, the terms "comprising" and "including" should not be construed to necessarily include all of the features, numbers, steps, operations, elements, components or combination thereof disclosed herein, and should be construed not to include some of the elements or steps thereof, or should be construed to further include additional features, numbers, steps, operations, elements, components or combination thereof.

Hereinafter, description will be given in detail of the preferred embodiments of the present disclosure with reference to the accompanying drawings.

Figure 2:
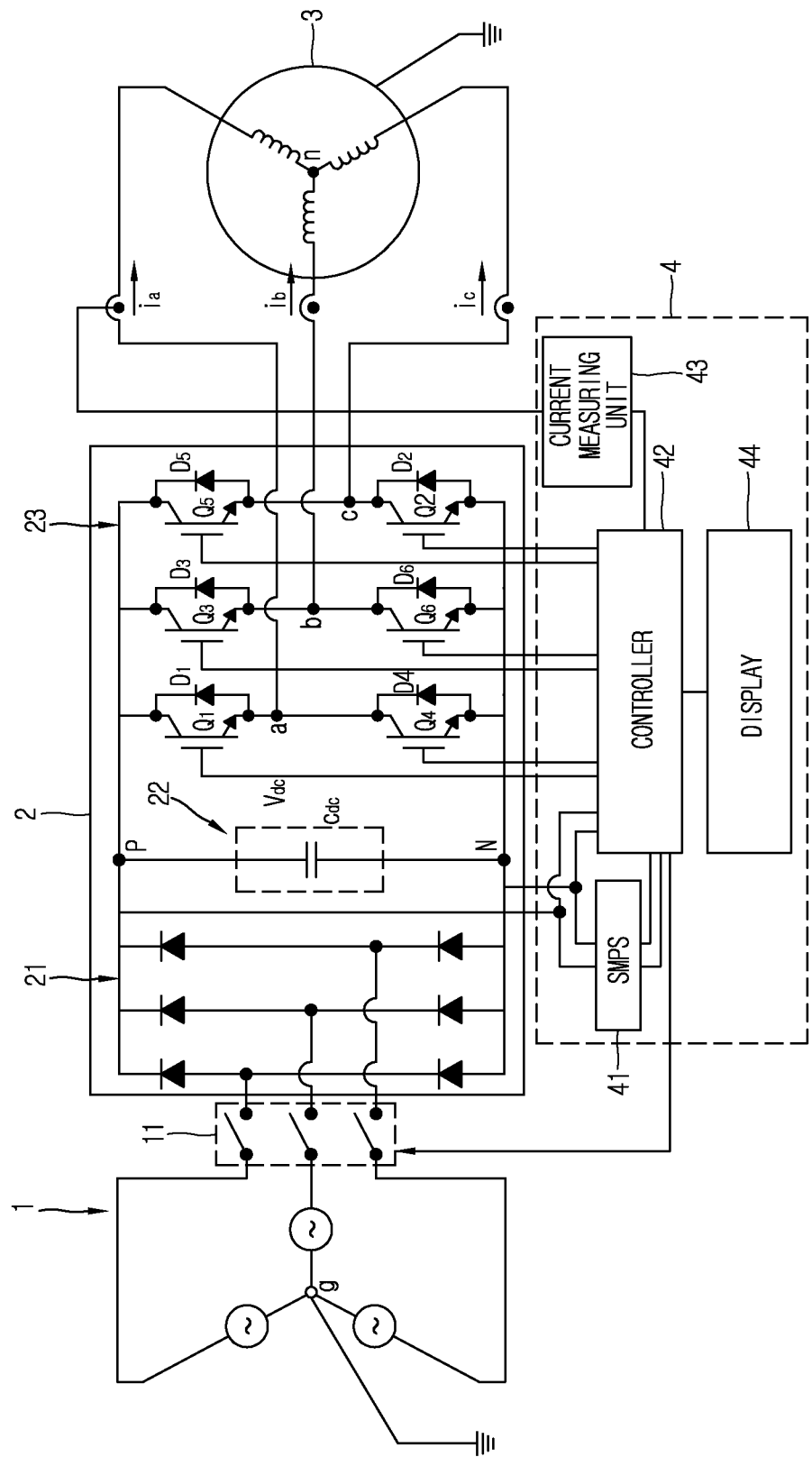
FIG. 2 is a configuration view of one exemplary embodiment illustrating an inverter system to which the present disclosure is applied and an apparatus for diagnosing a DC link capacitor according to the present disclosure.

FIG. 2 is a configuration view of one exemplary embodiment illustrating an inverter system to which the present disclosure is applied and an apparatus for diagnosing a DC link capacitor according to the present disclosure.

As shown in FIG. 2, an inverter system to which the present disclosure is applied may include an AC power supplier 1, an inverter 2 and a motor 3, and be connected with a diagnosis apparatus 4 for diagnosing a DC link capacitor 22 of the inverter 2 according to the present disclosure. A power source connector 11 may be placed between the AC power supply 1 and the inverter 2, to turn the inverter 2 on or off.

The diagnosis apparatus 4 according to the present disclosure may include a switching mode power supply (SMPS) 41, a controller 42, a current measuring unit 43 and a display 44.

The inverter 2 may include a rectifier 21, a DC link capacitor 22 and an inverter part 23.

First, the structure of the inverter 2 will be described.

The rectifier 21 may rectify three-phase AC input voltages input from the AC power supplier 1. The DC link capacitor 22 may smooth DC voltages which were rectified by the rectifier 21 and accumulate electric energy. The DC link capacitor 22 may also be called 'smoothing electrolytic capacitor,' but the term 'DC link capacitor' will be used herein in description.

The inverter part 23 may be connected to the DC link capacitor 22 to supply the smoothed DC voltages to the motor 3 in a switching manner. That is, the inverter part 23 may be formed by connecting 6 switching devices Q1 to Q6 to 6 diodes D1 to D6 in the form of a three-phase full bridge. The inverter unit 23 may convert the DC voltages transferred from the DC link capacitor 22 into three-phase AC voltages, and supply the three-phase AC voltages to the motor 3. The switching devices Q1 to Q6, for example, may be an insulated gate bipolar transistor (IGBT), but not limited to it.

Hereinafter, description will be given of the diagnosis apparatus 4 according to the present disclosure.

The SMPS 41 may be connected to the rectifier 21 to supply a DC voltage for control.

The current detecting unit 43 may detect a magnitude of a load current supplied to the motor 3, to provide to the controller 42. Although not shown, an analog/digital converter (ADC) for converting a current as an analog signal, detected by the current detector 43, into digital data may further be provided between the current detector 43 and the controller 42.

The controller 42 may control the 6 switching devices Q1 to Q6 of the inverter part 23 to be powered on or off, thereby generating three-phase AC voltages using predetermined voltage and frequency. The controller 42, for example, may be a microprocessor unit (MPU), but not limited to this.

The mechanism that the controller 42 drives the motor 3 through pulse width modulation (PWM) switching of the inverter part 23 is widely known in the art to which the present disclosure belongs, so detailed description thereof will not be repeated.

Hereinafter, the diagnosis apparatus 4 according to the present disclosure will be described.

FIGS. 3A to 3D are exemplary views showing a state of the inverter in response to the control of a controller of the diagnosis apparatus. FIGS. 3A to 3D illustrate the state of the inverter 2, so the diagnosis apparatus 4 according to the present disclosure is not shown in FIGS. 3A to 3D.

Figure 3A:
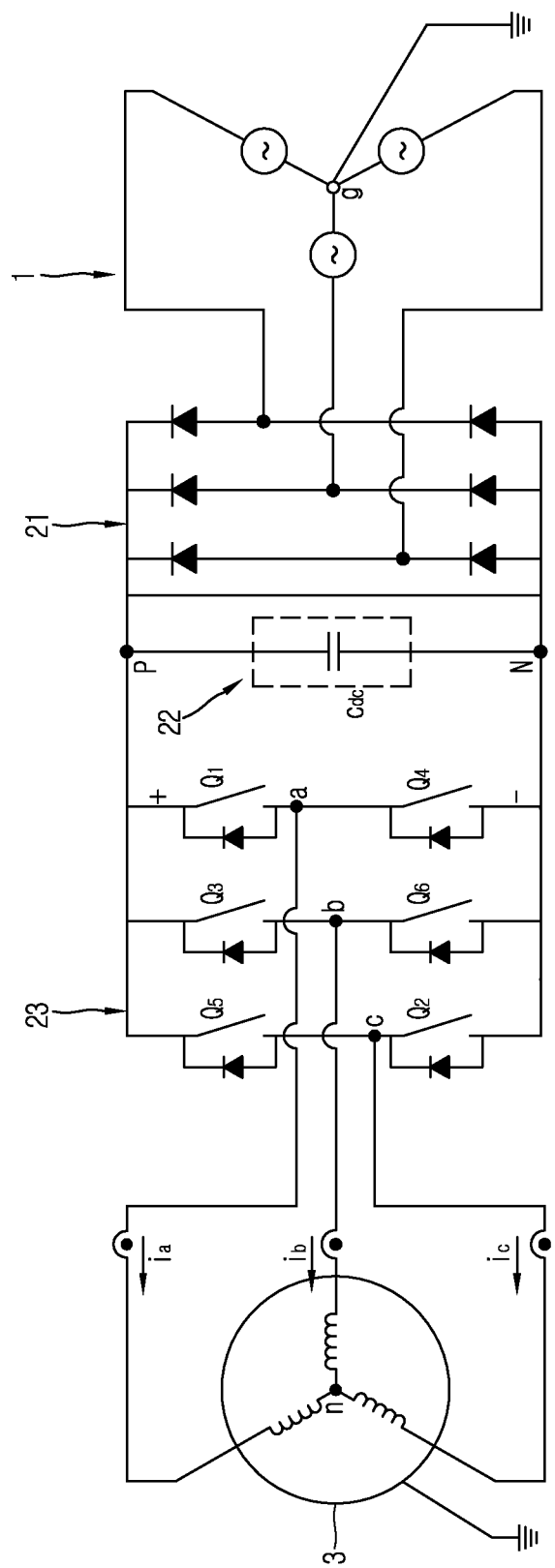
FIGS. 3A to 3D are exemplary views showing a state of the inverter in response to the control of a controller of the diagnosis apparatus.

As shown in FIG. 3A, after an AC voltage is applied from the AC power supplier 1, when the power source connector 11 is connected under the control of the controller 42 (FIG. 3A shows a connected state of the power source connector 11), three-phase AC voltages may be supplied to the rectifier 21 of the inverter 2.

The AC voltages rectified by the rectifier 21 may be smoothed by the DC link capacitor 22 and converted into DC voltages to be output.

The controller 42 may transmit a control signal to disconnect the power source connector 11 for diagnosis of the DC link capacitor 22. Afterwards, the controller 42 may switch on or off some of the switching devices Q1 to Q6, namely, Q1, Q2 and Q6, of the inverter part 23 so as to provide DC currents of a predetermined level from the SMPS 41 to the motor 3. Here, the other switching devices Q3, Q4 and Q5 may be off. Here, the Q1, Q2 and Q6 may manage paths of the three-phase currents provided to the motor 3, respectively. It can also be known that the Q1 is a first switching device of an upper leg, and the Q2 and Q6 are second and third switching devices of a lower leg.

Figure 3B:
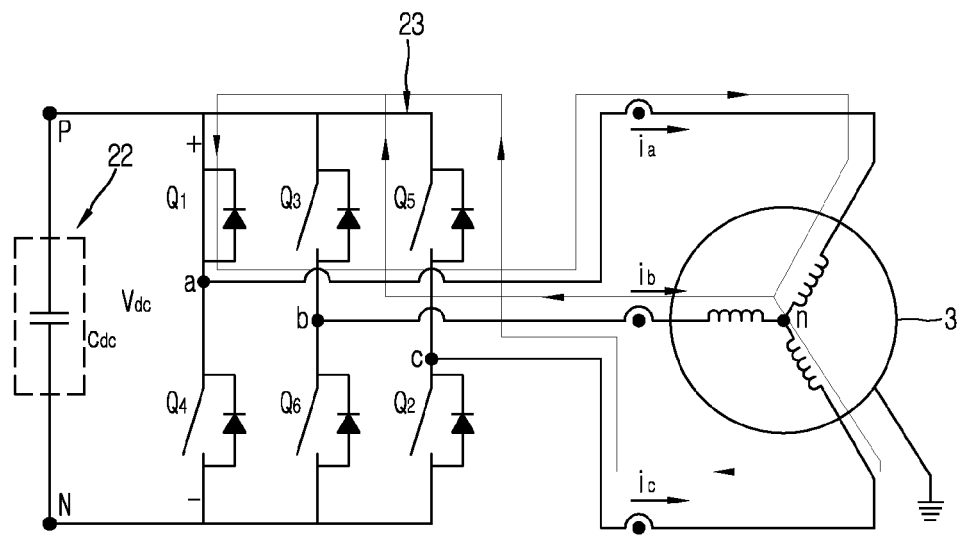
Figure 3C:
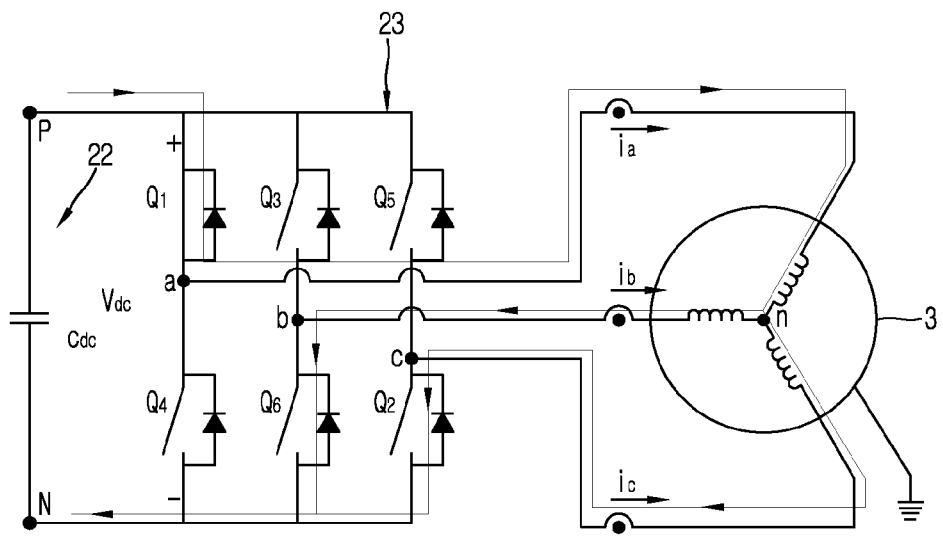
Figure 3D:
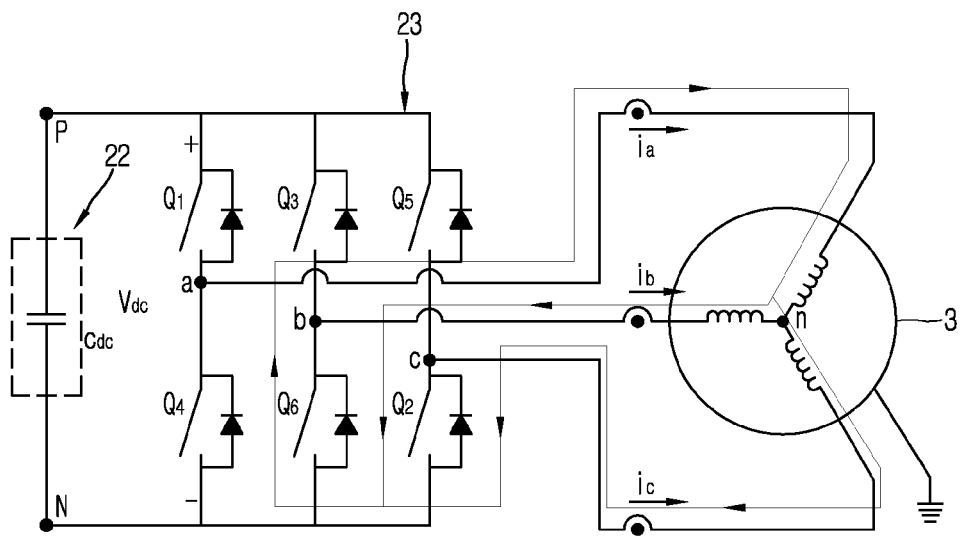

Referring to FIG. 3B, when the controller 24 switches the Q1 on and the Q2 and Q6 off, the flow of the currents may be generated through Q1, D3 and D5 and a freewheeling mode may be on (FIGS. 3B to 3D do not show the AC power supply 1 because the power source connector 11 is off). Here, the currents supplied to the motor 3 may slowly be lowered due to power being consumed by resister of the motor 3 and the SMPS 41.

Figure 4:
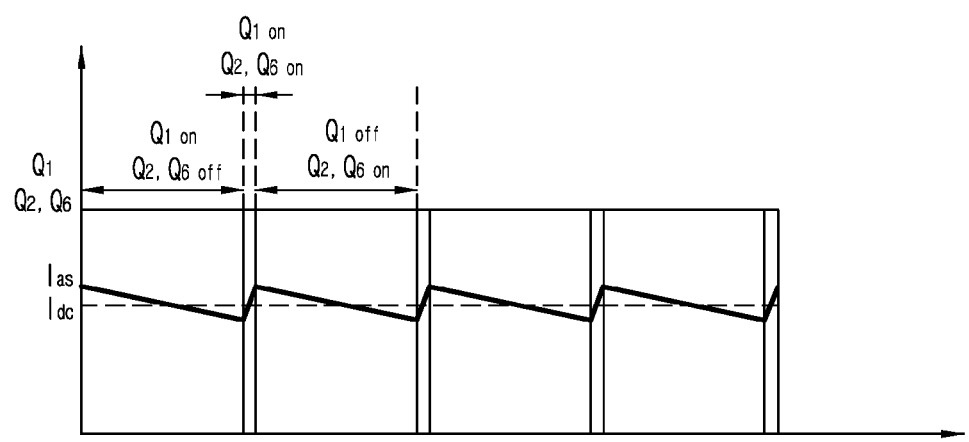
FIG. 4 is an exemplary view showing a switching waveform and a current state under control of the controller.

FIG. 4 is an exemplary view showing a switching waveform and a current state under the control of the controller.

When the controller 42 switches the Q1 on and the Q2 and Q6 off, the current las supplied to the motor 3 may slowly be lowered. When the current is lowered less than a reference current ldc by a predetermined level, the controller 42 may switch the Q2 and Q6 on and accordingly a state as shown in FIG. 3C may be on.

That is, referring to FIG. 3C, the current supplied to the motor 3 may flow from a terminal P through the motor 3 via the Q1 and then flow toward a terminal N via the Q2 and Q6. Here, as energy is acquired from the DC link capacitor 22, the current may increase. When the current increases higher than the reference current by a predetermined level, the controller 42 may switch the Q1 off and accordingly a state as shown in FIG. 3D may be on.

That is, referring to FIG. 3D, when the Q1 is off, the current may flow along a path passing through the Q2, Q6 and D4 and the freewheeling mode may be on. Even in this case, the current may be lowered due to power consumption by the resistor of the motor 3 and the SMPS 41. When the current is lowered less than the reference voltage by a predetermined level, the controller 42 may switch the Q1 on again, thereby forming the flow of the current as shown in FIG. 3C.

With the repetition of such switching pattern, a DC current of a predetermined level may flow on the motor 3, thereby realizing a predetermined power consumption. Here, the embodiment that the controller 42 applies the DC current of the predetermined current is merely illustrative. Therefore, the present disclosure may not be limited to the above embodiment.

After the power source connector 11 of FIG. 2 is disconnected, when a DC current of a predetermined magnitude flows on the motor 3, a voltage of the DC link capacitor terminal may be lowered, as shown in FIG. 4, due to power consumption of the resistor (not shown) of the motor 3, power consumption of the SMPS 41 and a switching loss. This may be expressed by equations associated with energy. Hereinafter, it will be described.

Energy charged in the DC link capacitor 22 may be expressed by Equation 1 as follows.

$$E_{CAPACITOR} = \frac{1}{2}CV^2 \quad \text{[Equation 1]}$$

Also, energy consumed by the resistor of the motor 3 and the SMPS 41 and switching loss energy may be expressed by Equation 2 as follows.

$$E_{LOSS} = (P_R + P_{SMPS} + P_{switching}) \cdot t \quad \text{[Equation 2]}$$

The variation of energy charged in the DC link capacitor 22 may be the same as energy consumed for a predetermined time. Therefore, the following Equation 3 may be derived if using the above Equation 1 and Equation 2.

$$\frac{1}{2} \cdot C_{ini} \cdot (V_1^2 - V_2^2) = (P_R + P_{SMPS} + P_{switching}) \cdot (t_{2\_ini} - t_1) \quad \text{[Equation 3]}$$

where $C_{ini}$ denotes an initial capacitance of the DC link capacitor 22, $V_1$ denotes a measurement start voltage, $t_1$ denotes a time when a voltage of the DC link is $V_1$, $V_2$ denotes a measurement stop voltage, $t_{2\_ini}$ denotes a time when the voltage of the DC link is $V_2$ in the initial capacitance, $P_{SMPS}$ denotes power consumed by the SMPS 41, $P_R$ denotes power consumed by the resistor (not shown) of the motor 3, and $P_{switching}$ denotes the switching loss power.

The $V_1$ and $V_2$ may be decided between the voltage of the DC link of the inverter 2 and a voltage that a low voltage trip is generated.

The switching loss and the power consumed by the SMPS 41 are not power consumed by a load. Therefore, they may not be considered in estimation of the DC link capacitor 22. That is, the two elements may be assumed as loss elements. Therefore, the combination thereof may be referred to as $F_{LOSS}$. Thus, Equation 3 may be expressed by Equation 4.

$$\frac{1}{2} \cdot C_{ini} \cdot (V_1^2 - V_2^2) = (P_R + P_{LOSS}) \cdot (t_{2\_ini} - t_1) \quad \text{[Equation 4]}$$

Since power consumption of a load to be measurable is $P_R$ and $F_{LOSS}$ is power non-measurable, $P_{LOSS}$ should be greater than $P_R$. In the meantime, the $P_{LOSS}$ may be proportional to a current whereas the $P_R$ may be inversely proportional to a square of the current. Hence, an accurate measurement may be allowed only when the current is applied to the inverter 2 or the motor 3 as much as possible (since $P_R$ increases more than $F_{LOSS}$). Thus, if Equation 4 is re-expressed by considering the relationship between $P_R$ and $P_{LOSS}$, the following Equation 5 may be acquired.

$$\frac{1}{2} \cdot C_{ini} \cdot (V_1^2 - V_2^2) = P_{R\_ini} \times \left(1 + \frac{P_{LOSS\_ini}}{P_{R\_ini}}\right) \cdot (t_{2\_ini} - t_1) = \quad \text{[Equation 5]}$$

$$k_{ini} \cdot P_{R\_ini} \cdot (t_{2\_ini} - t_1)$$

As shown in Equation 5, it may be noticed that the accuracy of measurement depends on a value k. Ideally, since $F_{LOSS}$ is 0, k is 1 (k=1). However, if $P_{LOSS}$ increases as high as being unignorable, k may increase higher than 1.

When a current applied to the motor 3 increases, k may be converging on 1. Therefore, the present disclosure proposes a method of applying the current as high as possible. Based on this, the accuracy of measurement may be predicted according to the change in power consumption of the inverter 2.

When the DC link capacitor 22 is deteriorated, the capacitance may be reduced and accordingly $C_{ini}$ of Equation 5 may be changed into $C_{old}$. Here, Equation 5 may be re-expressed by Equation 6.

$$\frac{1}{2} \cdot C_{old} \cdot (V_1^2 - V_2^2) = P_{R\_old} \times \left(1 + \frac{P_{LOSS\_old}}{P_{R\_old}}\right) \cdot (t_{2\_old} - t_1) = \quad \text{[Equation 6]}$$

$$k_{old} \cdot P_{R\_old} \cdot (t_{2\_old} - t_1)$$

Therefore, when Equation 6 is divided by Equation 5, a ratio of the capacitance after deterioration to an initial capacitance may be acquired, and this may be expressed by Equation 7.

$$\frac{C_{old}}{C_{ini}} = \frac{k_{old} \cdot P_{R\_old} \cdot (t_{2\_old} - t_1)}{k_{ini} \cdot P_{R\_ini} \cdot (t_{2\_ini} - t_1)} \quad \text{[Equation 7]}$$

In Equation 7, when states of a load within the inverter 2 and the motor 3, which is measured after the DC link capacitor 22 is deteriorated, is the same as a state measured when the DC link capacitor 22 is in a normal state, $k_{old} = k_{ini}$ and $P_{R\_old} = P_{R\_ini}$. Therefore, only a term associated with a discharge time may be left.

Figure 5:
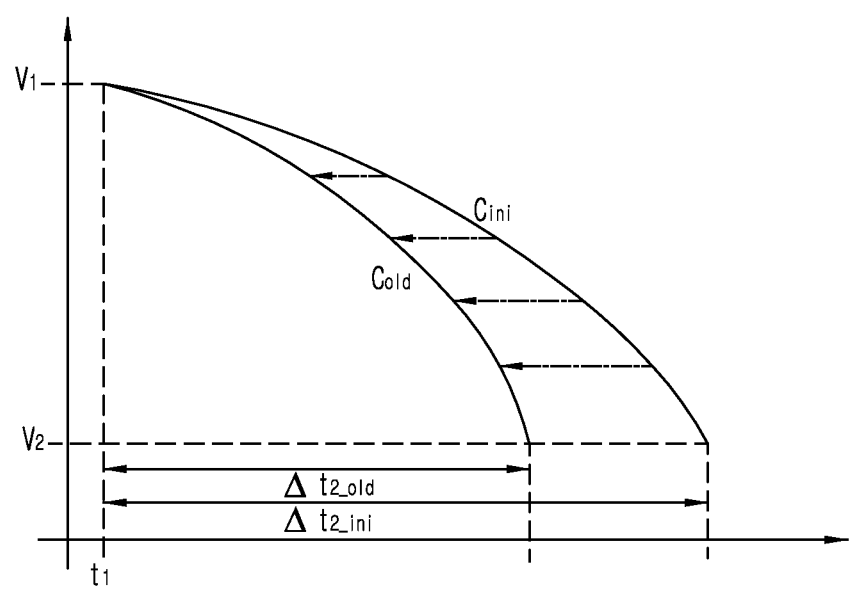
FIG. 5 is an exemplary view showing the change in a discharge time responsive to voltage reduction, in a DC link capacitor in a normal state and in a deteriorated state.

The relation between a voltage in this state and the DC link capacitor 22 is shown in FIG. 5. FIG. 5 is an exemplary view showing the changes in a discharge time, responsive to voltage reduction, in the DC link capacitor in a normal state and in a deteriorated state.

Meanwhile, when the states of the load within the inverter and the motor change, $k_{old}$ and $P_{R\_old}$ may differ from values obtained under an environment that the DC link capacitor 22 in the normal state was measured. If the load within the inverter 2 is change, the ratio of $P_{LOSS}$ to $P_R$ may be changed. This may result in the change in k. Also, when the motor 3 is changed, a current applied to the SMPS 31 is uniform but a stator resistance may be changed. Therefore, $P_R$ may be changed. In this case, if the measurement is carried out according to the aforementioned discharge time measurement method, a condition of a predetermined power consumption which was premised may not be satisfied. This may cause a great error. Therefore, the present disclosure proposes a method of directly estimating capacitance, as follows, when the initial state of the measurement and a state of measurement after deterioration are not the same as each other.

To directly estimate the capacitance of the DC link capacitor 22, the following Equation 8 may be acquired by varying Equation 5.

$$C = 2 \cdot k \cdot P_R \cdot (t_2 - t_1) \cdot \frac{1}{(V_1^2 - V_2^2)} \quad \text{[Equation 8]}$$

$P_R \cdot (t_2 - t_1)$ which is energy consumed by the load is power that the motor 3 consumes. There may be several methods for acquiring it, and the following methods may be considered.

1) Using a stator resistor, a current and a discharge time of the motor

2) Using a reference voltage, a current and a discharge time

3) Using a voltage, a current and an available discharge time of the DC link capacitor The available discharge time in Method 3), as aforementioned with reference to FIGS. 3A to 3D, denotes a time, for which a current actually flows, except for a freewheeling time.

The following tables 1 to 3 show, in an inverter and a motor under the same condition, a capacitance value corresponding to the DC link capacitor in a normal state, estimated by Equation 8, a capacitance value corresponding to the DC link capacitor in a deteriorated state, estimated by Equation 8, a ratio of the estimated capacitance values, a known reference capacitance value corresponding to the DC link capacitor in the normal state, a known reference capacitance value corresponding to the DC link capacitor in the deteriorated state, and a ratio of the know reference capacitance values. Here, the measured or estimated capacitance values are obtained based on motors of 3.7 kW, 7.5 kW and 15 kW, respectively.

TABLE 1

|  | 3.7 kW-380 V | | |
|---|---|---|---|
| $C_{ini\_ref}(\mu F)$ | 2000 | 1500 | 2000 |
| $C_{ini\_estimation}(\mu F)$ | 1809 | 1336 | 1809 |
| $C_{old\_ref}(\mu F)$ | 1500 | 1000 | 1000 |
| $C_{old\_estimation}(\mu F)$ | 1336 | 892 | 892 |
| $C_{old\_ref}/C_{ini\_ref}(\%)$ | 75.0 | 66.7 | 50.0 |
| $C_{old\_estimation}/C_{ini\_estimation}$ (%) | 73.8 | 66.7 | 49.3 |

TABLE 2

|  | 7.5 kW-380 V | | |
|---|---|---|---|
| $C_{ini\_ref}(\mu F)$ | 2000 | 1500 | 2000 |
| $C_{ini\_estimation}(\mu F)$ | 1821 | 1356 | 1821 |
| $C_{old\_ref}(\mu F)$ | 1500 | 1000 | 1000 |
| $C_{old\_estimation}(\mu F)$ | 1356 | 898 | 898 |
| $C_{old\_ref}/C_{ini\_ref}(\%)$ | 75.0 | 66.7 | 50.0 |
| $C_{old\_estimation}/C_{ini\_estimation}$ (%) | 74.4 | 66.2 | 49.3 |

TABLE 3

|  | 15 kW-380 V | | |
|---|---|---|---|
| $C_{ini\_ref}(\mu F)$ | 2000 | 1500 | 2000 |
| $C_{ini\_estimation}(\mu F)$ | 1634 | 1213 | 1634 |
| $C_{old\_ref}(\mu F)$ | 1500 | 1000 | 1000 |
| $C_{old\_estimation}(\mu F)$ | 1213 | 812 | 812 |
| $C_{old\_ref}/C_{ini\_ref}(\%)$ | 75.0 | 66.7 | 50.0 |
| $C_{old\_estimation}/C_{ini\_estimation}(\%)$ | 74.2 | 66.9 | 49.7 |

That is, as shown above, it can be noticed that an estimated capacitance value may be a little bit different from a reference capacitance value, but the ratio ($C_{old\_estimation}/C_{ini\_estimation}$) is not greatly different from a ratio of the reference capacitance.

The following table 4 shows the changes in capacitance values by measuring an initial capacitance value using a motor of 7.5 kW and measuring a capacitance value after deterioration using a motor of 3.7 kW.

TABLE 4

| $C_{ini\_ref}(\mu F)$ | 2000→1500 | 1500→1000 | 2000→1000 |
|---|---|---|---|
| $C_{old\_ref}/C_{ini\_ref}(\%)$ | 75 | 66.7 | 50 |
| $C_{old\_estimation}/C_{ini\_estimation}(\%)$ | 73.5 | 65.6 | 49.1 |

That is, as shown above, it may be noticed that a difference in the estimation of individual capacitance values is generated but the estimation of the ratio of change according to the present disclosure shows a less error rate. Also, the deteriorated level of the DC link capacitor 22 may be determined based on the ratio of change.

That is, the controller 42 may measure the ratio of change of capacitances using a voltage of a DC link capacitor terminal and a load current, which are currently measured in the inverter 2. Also, the controller 42 may measure the changes in the capacitance values using Equation 3 even if a state is somewhat changed from the initial state of the measurement.

The controller 42 may estimate a ratio of the estimated deteriorated capacitance value to an initial value of the DC link capacitor 22. When an estimated ratio is less than a predetermined ratio (for example, 85%), the controller 42 may diagnose the breakdown of the DC link capacitor 22.

When the controller 42 diagnoses the breakdown of the DC link capacitor 22, the controller 42 may control the display 44 to output information that the breakdown has been diagnosed, so as to warn a user. This may result in preventing in advance accidents, such as damages on components, occurrence of fire and the like, due to the breakdown of the DC link capacitor 22.

Since the diagnosis of the breakdown according to the present disclosure may use the motor which is already connected to discharge a DC link voltage, the ratio of change of capacitance values may be estimated without a separate discharge circuit.

Even when the motor connected to the inverter is changed, the diagnosis apparatus according to the present disclosure may also be applied thereto. Therefore, a deteriorated level of the DC link capacitor may be recognized, irrespective of the replacement of the motor.

This may allow the present disclosure to be directly applied to commercial inverters which are on sale. With no need of hardware change, the present disclosure may be applied even to an inverter, which has already been sold, in an upgraded form of software.

Also, the breakdown diagnosis according to the present disclosure may measure changes in capacitance values more frequently than the breakdown diagnosis in the related art. This may result in improving reliability and efficiency of the inverter and preventing in advance accidents such as damages on components, occurrence of fire and the like, due to the breakdown.

The foregoing embodiments and advantages are merely exemplary and many alternatives, modifications, and variations will be apparent to those skilled in the art. Therefore, it should be understood that the above-described embodiments should be construed broadly within its scope as defined in the appended claims.

As described above, with use of a motor for discharging a DC link voltage, any additional circuit such as a discharge circuit may not be required and the ratio of change of capacitance values may be measured using a DC link voltage and a load current which are currently measured in an inverter.

The change in capacitance values may be estimated even if a measurement state is somewhat changed while the initial measurement state changes to a deteriorated state. This may allow the level of breakdown of the capacitance to be determined so as not to be sensitive to affection by an environment, as compared with the related art.

The diagnosis apparatus according to the present disclosure may be applied directly to commercial inverters which are on sale now. Also, without hardware change required, the diagnosis apparatus according to the present disclosure may be applied even to already sold inverters in an upgraded form of software.

Also, the diagnosis apparatus according to the preset disclosure may measure the change in capacitance more frequently than the related art diagnosis apparatus. This may result in improving reliability and efficiency of the inverter and preventing in advance accidents such as damages on components, occurrence of fire and the like, due to the breakdown.

What is claimed is:

1. A diagnosis apparatus for diagnosing deterioration of a DC link capacitor of an inverter having the DC link capacitor and an inverter part comprising a plurality of switching devices generating three phase AC voltages to a load connected to the diagnosis apparatus, the diagnosis apparatus comprising:
   a current detector configured to detect a current supplied to a motor in the inverter part;
   a switching mode power supplier (SMPS) configured to supply a DC voltage and to be coupled to the DC link capacitor; and
   a controller configured to control the DC voltage supplied from the SMPS to the motor to have a predetermined level, the controller being arranged to estimate the change of a ratio of a deteriorated capacitance to an initial capacitance of the DC link capacitor by considering power consumption of the motor, power consumption of the SMPS and a switching loss of the inverter part, wherein the estimation includes, in response to the voltage of the DC link capacitor reaching a predetermined final level:
   determining a first factor, k_old, based on a ratio of the power consumption of the SMPS and switching loss to power consumption of the motor using the deteriorated capacitance of the DC link capacitor,
   determining a second factor, k_int, based on a ratio of the power consumption of the SMPS and switching loss to power consumption of the motor using the initial capacitance of the DC capacitor,
   determining a first product by multiplying the first factor, k_old, with a rate of the power consumption of the motor using the deteriorated capacitance of the DC link capacitor,
   determining a second product by multiplying the second factor, k_int, with the rate of the power consumption of the motor using the initial capacitance of the DC link capacitor,
   determining a quotient of the first and second products to diagnose the DC link capacitor, and
   controlling the plurality of switching devices in a preset manner such that the controller detects the capacitance of the DC link capacitor.

2. The diagnosis apparatus of claim 1, wherein the inverter part is configured by connecting a plurality of switching devices and a plurality of diodes, connected in parallel, in a form of a three-phase full bridge, wherein the controller controls the DC voltage supplied from the SMPS to have the predetermined level by controlling an ON or OFF state of the plurality of switching devices.

3. The diagnosis apparatus of claim 2, wherein the inverter part is configured by connecting the plurality of switching devices and the plurality of diodes, connected in parallel, in the form of the three-phase full bridge, wherein the switching devices are arranged in a pair of switches and each of the pair of switches are connected in parallel and first to third switching devices form paths of first to third-phase currents supplied to the motor, and each of the first to the third switching devices is connected in parallel to each other, wherein the first switching device forms an upper leg and the second and third switching devices form a lower leg.

4. The diagnosis apparatus of claim 3, wherein the controller controls the first to third switching devices to be switched on when a current supplied to the motor is lowered less than a reference current by a predetermined level in case where the current supplied into the motor flows in a freewheeling mode.

5. The diagnosis apparatus of claim 3, wherein the controller controls the first switching device to be switched on and the second and third switching devices to be switched off when the current supplied to the motor increases more than a reference current by a predetermined level in case where the current supplied to the motor increases due to acquiring energy from the DC link capacitor.

6. The diagnosis apparatus of claim 3, wherein the controller controls the first switching device to be switched off and the second and third switching devices to be switched on when the current supplied to the motor increases more than a reference current by a predetermined level in case where the current supplied to the motor increases due to acquiring energy from the DC link capacitor.

7. The diagnosis apparatus of claim 1, wherein the capacitance of the DC link capacitor is estimated by the following equation:

$$C = 2 \cdot k \cdot P_R \cdot (t_2 - t_1) \cdot \frac{1}{(V_1^2 - V_2^2)}$$

where k denotes a constant indicating a ratio of power consumption of the SMPS and switching loss to power consumption of the motor, $P_R$ denotes the power consumption of the motor, $V_1$ denotes a voltage of the DC link capacitor measured at an initial time $t_1$, $V_2$ denotes a voltage of the DC link capacitor at a predetermined time $t_2$.

8. The diagnosis apparatus of claim 1, wherein the DC link capacitor is diagnosed as being broken down when the change of the ratio is lowered less than a predetermined ratio.

9. The diagnosis apparatus of claim 1, wherein the controller controls the SMPS to increases a voltage supplied by SMPS to by the maximum permissible limit so as to reduce the ratio of the power consumption of the SMPS and the switching loss to the power consumption of the load.

10. The diagnosis apparatus of claim 4, wherein the controller is configured to control fourth to sixth switching devices to be switched off.

11. The diagnosis apparatus of claim 6, wherein the controller is configured to control fourth to sixth switching devices to be switched off.

12. The diagnosis apparatus of claim 7, wherein the controller is configured to control fourth to sixth switching devices to be switched off.

* * * * *